United States Patent
Ho

(10) Patent No.: US 11,024,351 B1
(45) Date of Patent: Jun. 1, 2021

(54) MEMORY DEVICE AND OPERATING METHOD FOR CONTROLLING NON-VOLATILE MEMORY

(71) Applicant: Winbond Electronics Corp., Taichung (TW)

(72) Inventor: Wen-Chiao Ho, Taichung (TW)

(73) Assignee: Winbond Electronics Corp., Taichung (TW)

(*) Notice: Subject to any disclaimer, the term of this patent is extended or adjusted under 35 U.S.C. 154(b) by 0 days.

(21) Appl. No.: 17/020,837

(22) Filed: Sep. 15, 2020

(51) Int. Cl.
*G11C 7/24* (2006.01)
*G11C 7/10* (2006.01)

(52) U.S. Cl.
CPC .............. *G11C 7/24* (2013.01); *G11C 7/1069* (2013.01); *G11C 7/1096* (2013.01)

(58) Field of Classification Search
CPC ........ G11C 7/24; G11C 7/1096; G11C 7/1069
See application file for complete search history.

(56) References Cited

U.S. PATENT DOCUMENTS

| | | | |
|---|---|---|---|
| 8,072,804 B2* | 12/2011 | Lee | G11C 11/5628 365/185.03 |
| 9,213,598 B2* | 12/2015 | Seo | G06F 11/1048 |
| 9,355,724 B2* | 5/2016 | Oh | G11C 16/26 |
| 9,396,798 B2* | 7/2016 | Hu | H01L 23/49838 |
| 9,728,520 B2* | 8/2017 | Hu | H01L 25/0657 |
| 9,836,236 B2* | 12/2017 | Shu | G06F 3/0626 |
| 2011/0170346 A1* | 7/2011 | Nagai | G11C 11/5628 365/185.2 |
| 2019/0325167 A1* | 10/2019 | Hershman | H04L 9/0897 |

* cited by examiner

*Primary Examiner* — Tri M Hoang
(74) *Attorney, Agent, or Firm* — JCIPRNET

(57) ABSTRACT

A memory device and an operating method for controlling a non-volatile memory are provided. The non-volatile memory includes segments. Each of the segments includes memory cells. The operating method includes the following steps. A programming operation is performed multiple times on the memory cells in sequence according to increment commands, a segment order, and a memory cell order. When receiving a read command, a read operation is performed multiple times on the memory cells according to the segment order and the memory cell order until a last programmed memory cell is learned. According to an address of the last programmed memory cell, a replay-protected monotonic count value associated with a number of the increment commands is calculated.

20 Claims, 9 Drawing Sheets

Perform a programming operation multiple times on a plurality of memory cells of a plurality of segments of a non-volatile memory in sequence according to a plurality of increment commands, a segment order, and a memory cell order — S110

Perform a read operation multiple times according to the segment order and the memory cell order until a last programmed memory cell is learned — S120

Calculate, according to an address of the last programmed memory cell, a replay-protected monotonic count value associated with a number of the increment commands — S130

MEMORY DEVICE AND OPERATING METHOD FOR CONTROLLING NON-VOLATILE MEMORY

BACKGROUND

Technical Field

The disclosure relates to a memory device and an operating method, and in particular, to a memory device and an operating method for a replay-protected monotonic counter.

Description of Related Art

In general, memory devices are not protected from attacks against hardware. Therefore, a hacker can access a memory device to tamper with data stored therein. To prevent attacks by hackers, some memory devices are designed to require authentication of the identity of a user with respect to a command sent to the memory device. In a method for identity authentication, signatures for authentication by the user and the memory device are generated.

The replay-protected monotonic counter (RPMC) is one of encryption protocols. The RPMC may be configured to enhance security requirements of a memory device on applications such as Internet of Things (IoT). The RPMC provides a dynamic replay-protected monotonic count value. The RPMC can increment the replay-protected monotonic count value according to an operation of the memory device or an operation of a related device connected to the memory device, and can provide the replay-protected monotonic count value according to an external instruction. Therefore, the replay-protected monotonic count value is randomly incremented. The hacker has no way of learning the replay-protected monotonic count value of the RPMC. Only the user (because the user controls the operation of a counter) and the memory device (because information is stored in a memory array) know the replay-protected monotonic count value. In other words, only the user can complete identity verification by using the replay-protected monotonic count value to obtain the right to operating the memory device.

The RPMC performs programming operations on a plurality of memory cells of a memory one by one according to each increment command, and counts a number of programming operations only upon receiving a read command, so as to obtain the replay-protected monotonic count value. It should be noted that the RPMC needs to read the plurality of memory cells of the memory one by one to learn the number of memory cells programmed due to the increment command. The number of the read operations are substantially proportional to the number of the memory cells programmed due to the increment command. Therefore, when more memory cells are programmed due to the increment command, more read operations are required, so that it takes a long time for the RPMC to learn the replay-protected monotonic count value.

SUMMARY

The invention provides a memory device and an operating method for accelerating the learning of a replay-protected monotonic count value.

The operating method of the invention is adapted for controlling a non-volatile memory. The non-volatile memory includes a plurality of segments. The plurality of segments are arranged in a segment order. A plurality of memory cells of each of the segments are arranged in a same memory cell order. The operating method includes the following steps. A programming operation is performed multiple times on the plurality of memory cells of the plurality of segments in sequence according to a plurality of increment commands, a segment order, and a memory cell order. When a read command is received, a read operation is performed multiple times according to the segment order and the memory cell order until a last programmed memory cell is learned. According to an address of the last programmed memory cell, a replay-protected monotonic count value associated with a number of the increment commands is calculated.

The memory device of the invention is adapted for being used as a replay-protected monotonic counter. The memory device includes a non-volatile memory and a controller. The non-volatile memory includes a plurality of segments. The plurality of segments are arranged in a segment order. A plurality of memory cells of each of the segments are arranged in a same memory cell order. The controller is coupled to the non-volatile memory. The controller is configured to receive a plurality of increment commands, perform a programming operation multiple times on the plurality of memory cells of the plurality of segments in sequence according to the plurality of increment commands, the segment order, and a memory cell order. The controller is further configured to perform, when a read command is received, a read operation multiple times according to the segment order and the memory cell order until a last programmed memory cell is learned, and calculate a replay-protected monotonic count value according to an address of the last programmed memory cell.

Based on the foregoing, in the invention, the programming operation is performed multiple times on the memory cells in sequence according to the plurality of increment commands, the segment order, and the memory cell order. In the invention, the read operation is performed multiple times according to a read command, the segment order, and the memory cell order to learn the last programmed memory cell. In addition, the replay-protected monotonic count value associated with the number of increment commands is further calculated according to the address of the last programmed memory cell. In this way, the learning of the replay-protected monotonic count value can be accelerated.

To make the above-mentioned features and advantages of the invention more comprehensible, the following gives a detailed description of embodiments with reference to accompanying drawings.

DESCRIPTION OF THE EMBODIMENTS

Figure 1:
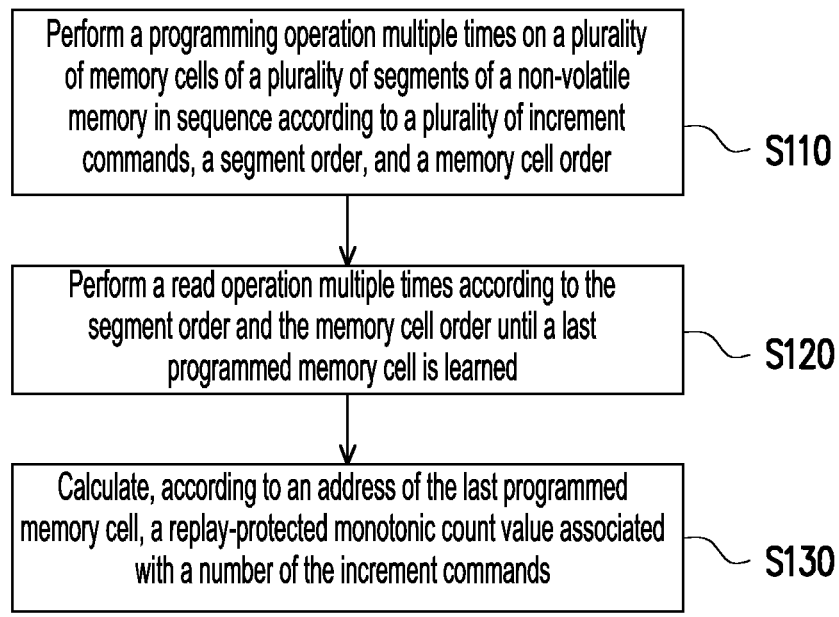
FIG. 1 is a method flowchart of an operating method according to a first embodiment of the invention.
Figure 2:
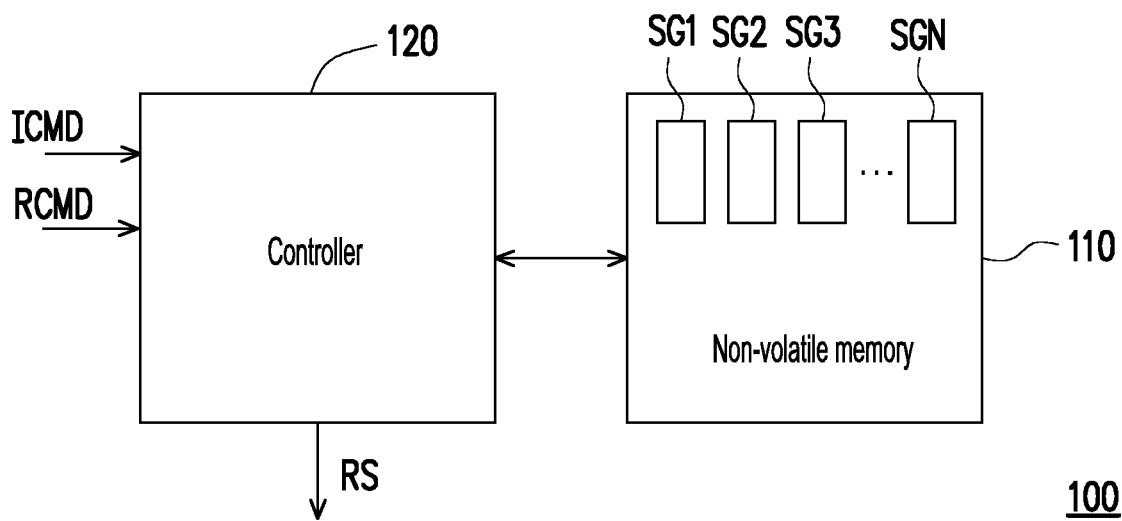
FIG. 2 is a schematic diagram of a memory device according to the first embodiment of the invention.

FIG. 1 is a method flowchart of an operating method according to a first embodiment of the invention. FIG. 2 is a schematic diagram of a memory device according to the first embodiment of the invention. Referring to FIG. 1 and FIG. 2, a memory device 100 includes a non-volatile memory 110 and a controller 120. The non-volatile memory 110 includes N segments SG1-SGN, and each of the segments SG1-SGN has M memory cells, and M and N are positive integers greater than 1. In other words, each of the segments SG1-SGN has M bits. Each of the segments SG1-SGN is arranged in a segment order. M memory cells in each of the segments SG1-SGN are arranged in the same memory cell order. In the present embodiment, the segment order and the memory cell order are respectively a programming order used to be associated with an increment command ICMD. The segment order and the memory cell order are also respectively a memory cell read order used to be associated with the replay-protected monotonic counter (RPMC). The non-volatile memory 110 may be, for example, ferroelectric random access memory, a phase change random access memory, a magnetoresistive random access memory, a resistive random access memory, or a combination thereof.

In the present embodiment, the controller 120 is coupled to the non-volatile memory 110. The controller 120 receives a plurality of increment commands ICMD in step S110, and performs a programming operation multiple times on the memory cells of the segments SG1-SGN in sequence according to the plurality of increment commands ICMD, the segment order, and the memory cell order. For example, in step S110, when receiving a first increment command ICMD, the controller 120 performs a single programming operation on a single memory cell of the segments SG1-SGN according to the segment order and the memory cell order. Next, when receiving a second increment command ICMD, the controller 120 performs a single programming operation on another memory cell of the segments SG1-SGN according to the segment order and the memory cell order. In other words, when receiving one increment command ICMD, the controller 120 performs one programming operation on the non-volatile memory 110 according to the segment order and the memory cell order. In the present embodiment, the programming operation is an operation to convert a logic value of the memory cell from "1" to "0".

The controller 120 receives a read command RCMD in step S120, and performs a read operation multiple times according to the read command RCMD, the segment order, and the memory cell order until a last programmed memory cell is learned. For example, in step S120, when receiving the read command RCMD, the controller 120 performs a read operation multiple times on the non-volatile memory 110 according to the segment order and the memory cell order. When learning the last programmed memory cell in the non-volatile memory 110, the controller 120 stops the read operation.

In step S130, the controller 120 calculates, according to information about the last programmed memory cell, a replay-protected monotonic count value RS associated with a number of the increment commands ICMD. In detail, the controller 120 can calculate a number of programmed memory cells (equivalent to the number of increment commands ICMD) according to an address of the last programmed memory cell, and then calculate the replay-protected monotonic count value RS associated with the number of increment commands ICMD.

It is worth mentioning that the controller 120 performs programming operations on the non-volatile memory 110 based on the segment order and the memory cell order. The controller 120 further performs a read operation on the non-volatile memory 110 based on the segment order and the memory cell order until the last programmed memory cell is learned, and calculates the replay-protected monotonic count value RS according to the information about the last programmed memory cell. Compared to a manner in which a current RPMC performs the read operation on a plurality of memory cells of the memory one by one, the memory device 100 can learn the replay-protected monotonic count value RS more quickly.

Figure 3:
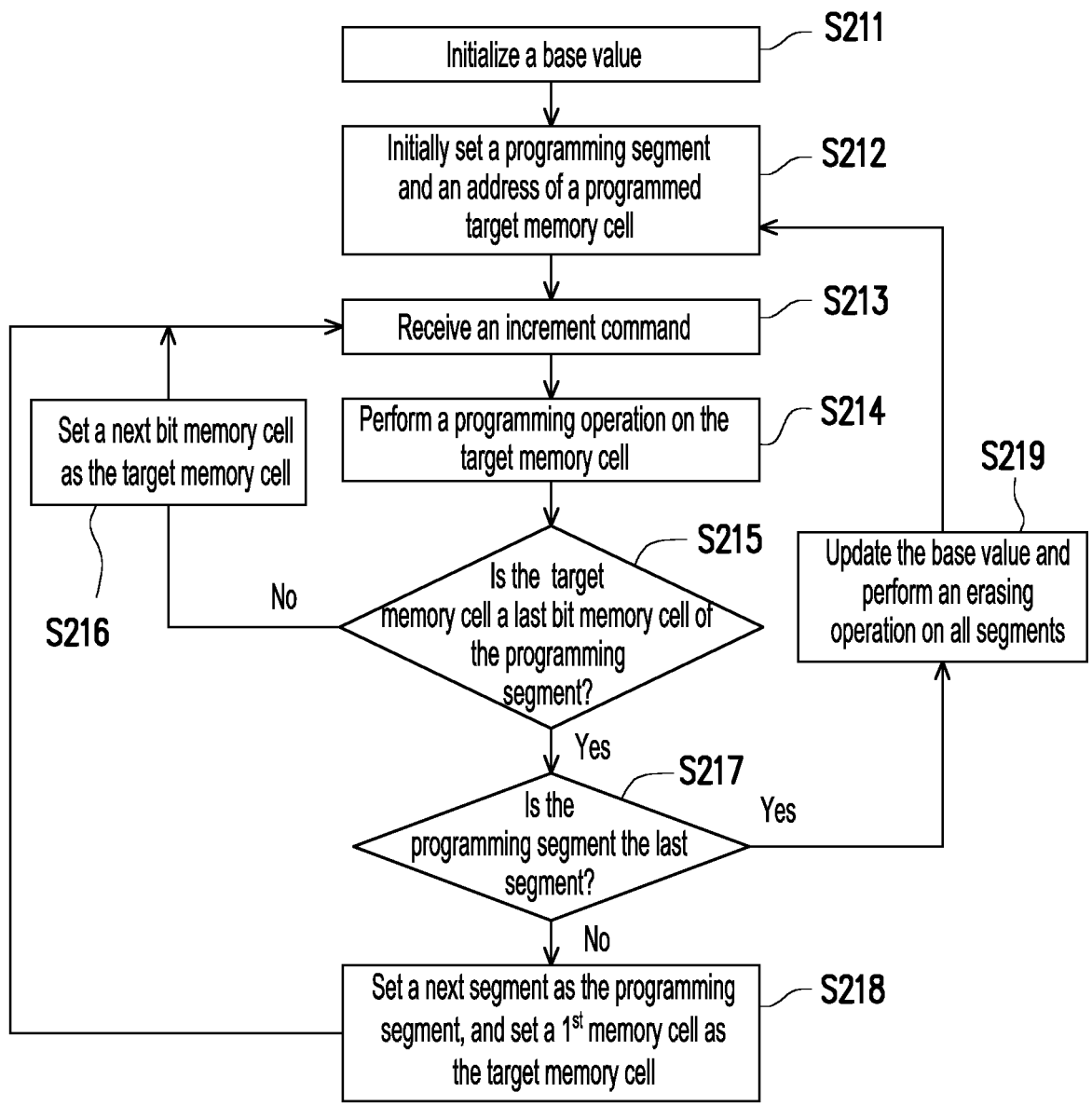
FIG. 3 and FIG. 4 are respectively a method flowchart and a schematic example diagram of programming steps of an operating method according to a second embodiment of the invention.

FIG. 3 is a method flowchart of programming steps of an operating method according to a second embodiment of the invention. Referring to FIG. 1 to FIG. 3, the programming steps of the present embodiment is applicable to step S110 of the first embodiment. In the present embodiment, the controller 120 initializes a base value B in step S211. Herein, the controller 120 initially sets the base value B to 0 (the invention is not limited thereto). In the present embodiment, the base value B is a total number of accumulated programmed memory cells in the non-volatile memory 110 when memory cells of all segments SG1-SGN in the non-volatile memory 110 are programmed. In detail, when the memory cells of all segments SG1-SGN in the non-volatile memory 110 are programmed, the controller 120 adds a preset value to the base value B, and then erases the memory cells of all segments SG1-SGN in the non-volatile memory 110. In the present embodiment, for example, the preset value is equal to a total number of memory cells in the non-volatile memory 110. For example, if there are 8 segments SG1-SG8 (that is, N=8), and each segment has 4,096 bits (that is, M=4096), the preset value may be N*M=32,768. In some embodiments, the preset value may be greater than the total number of memory cells in the non-volatile memory 110. In the present embodiment, an erasing operation is an operation to convert the logic value of the memory cell from "0" to "1".

In step S212, the controller 120 initially sets a programming segment and an address of a programmed target memory cell in the programming segment. In detail, the controller 120 sets a $j^{th}$ segment as the programming segment, and sets an $i^{th}$ bit memory cell of the $j^{th}$ segment as the programmed target memory cell. Therefore, the controller 120 initially sets values of i and j in step S212. For example, the controller 120 sets a $1^{st}$ segment as the programming segment, and initially sets a $1^{st}$ bit memory cell of the programming segment as the programmed target memory cell (that is, it is set that i=1, j=1). In other words, step S211 and step S212 are initialization steps in the programming step. In the present embodiment, $1 \le j \le N$, $1 \le i \le M$.

In step S213, when the controller 120 receives an increment command ICMD, the controller 120 performs a programming operation on the target memory cell in step S214. For example, when the controller 120 receives the increment command ICMD for the first time in step S213, the controller 120 performs a programming operation on the $1^{st}$ bit memory cell of the $1^{st}$ segment. If the controller 120 does not receive the increment command ICMD in step S213, the controller remains to wait for the increment command ICMD in step S213.

In step S215, the controller 120 determines whether the target memory cell is a last bit memory cell of the programming segment. If the target memory cell is not the last bit memory cell of the programming segment, the controller 120 sets a next bit memory cell as the target memory cell in step S216, and returns to step S213 to wait for a next increment command ICMD. In detail, the controller 120 sets the next bit memory cell of the programming segment as the target memory cell according to a memory cell order in step S216, for example, it is set that i=i+1 (a value of j is unchanged). In other words, in the present embodiment, the controller 120 performs a programming operation on the plurality of memory cells of the programming segment in an incremental memory cell order based on a cycle of step S213-step S216. In other embodiments, in step S212, the controller 120 may initially set a last bit memory cell of a 1st segment SG1 as a programmed target memory cell (that is, it is set that i=M, j=1). At this time, in step S216, it is set that i=i−1. Therefore, the controller 120 performs the programming operation on the plurality of memory cells of the programming segment in a decremental memory cell order based on the cycle of step S213-step S216.

In addition, in step S215, if the target memory cell is the last bit memory cell of the programming segment, it means that the last bit memory cell of the programming segment is programmed. At this time, the controller 120 determines whether the programming segment is the last segment in step S217. If the programming segment is not the last segment, the controller 120 sets a $1^{st}$ bit memory cell of a next segment as a target memory cell in step S218, and returns to step S213 to wait for a next increment command ICMD. In detail, in step S218, the controller 120 sets the next segment as the programming segment according to a segment order, and sets a $1^{St}$ memory cell of the programming segment as the target memory cell according to the memory cell segment. For example, it is set that j=j+1 and i=1. In other words, in the present embodiment, when programming on a plurality of memory cells of the programming segment is completed, the controller 120 performs programming the operation on the plurality of memory cells of the next segment in an incremental segment order based on the cycle of step S213-step S216.

In addition, in step S217, if the programming segment is the last segment, the controller 120 updates the base value B in step S219, performs an erasing operation on the memory cells of all segments SG1-SGN, and returns to step S212 to initially reset the programming segment and the address of the programmed target memory cell in the programming segment. In other words, when the memory cells of all segments SG1-SGN are programmed, after the controller 120 updates the base value B and erases all memory cells, and step S212 is re-performed. In the present embodiment, a preset value is added to the base value in step S219. The preset value is greater than or equal to a total number of the memory cells of all segments SG1-SGN. Afterwards, the controller 120 returns to step S212 to initialize values of i and j.

Figure 4:
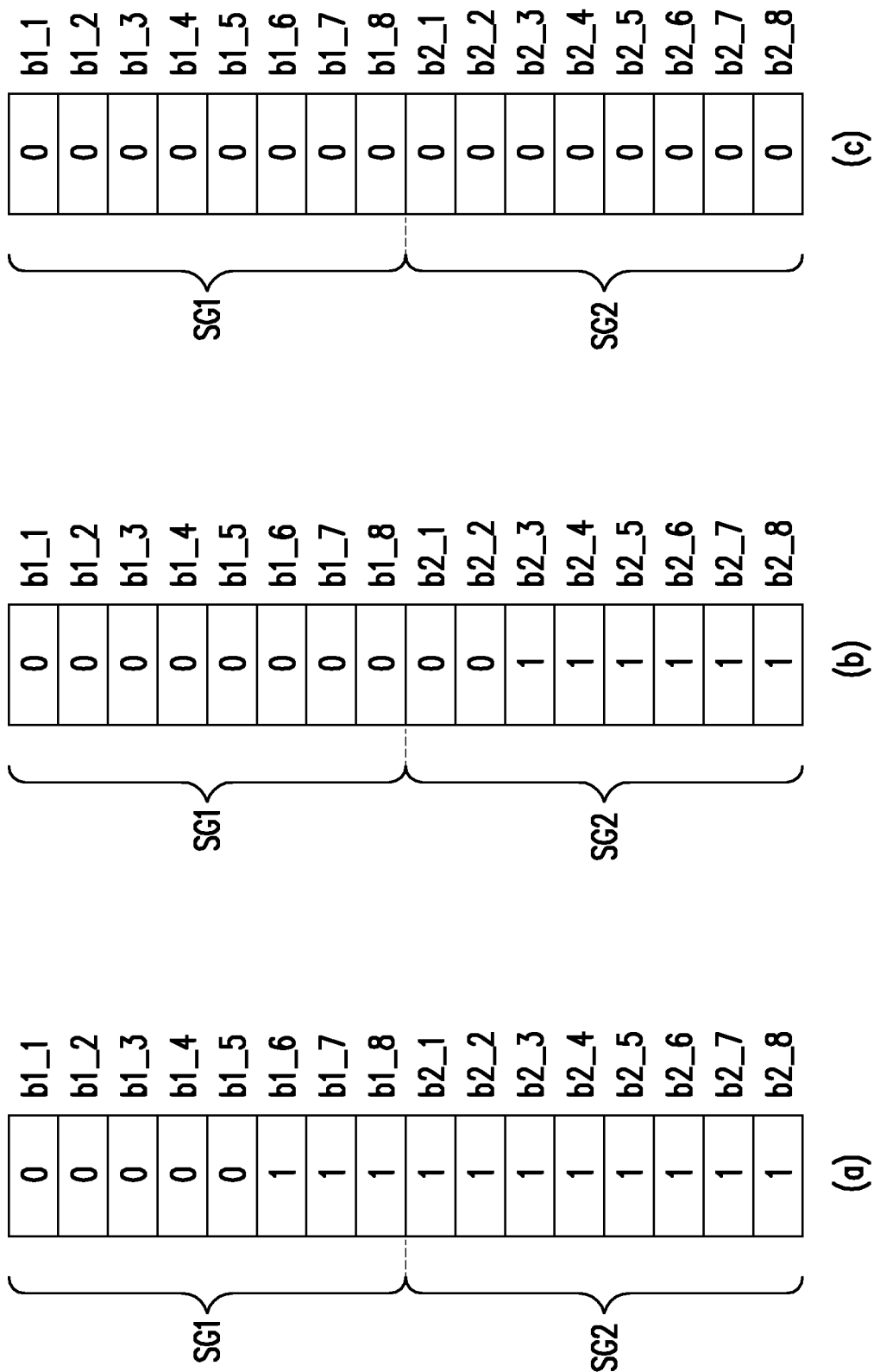

FIG. 4 is a schematic example diagram of programming steps of an operating method according to the second embodiment of the invention. In FIG. 4, for example, two segments SG1 and SG2 each include eight memory cells. The segment SG1 includes memory cells b1_1-b1_8. The segment SG2 includes memory cells b2_1-b2_8. An example (a) is a programming result that five increment commands ICMD are received. An example (b) is a programming result that ten increment commands ICMD are received. An example (c) is a programming result that 16 increment commands ICMD are received.

Referring to FIG. 2 to FIG. 4, first, a controller 120 sets a base value B to 0, sets a $1^{st}$ segment to a programming segment, and sets a $1^{st}$ bit memory cell b1_1 of the programming segment SG1 to a programmed target memory cell (step S211, step S212). When receiving increment command ICMD, the controller 120 performs a programming operation on the target memory cell b1_1 (step 213, step S214). Next, the controller 120 determines that the target memory cell b1_1 is not a last bit memory cell of the programming segment SG1 (step S215). Therefore, the controller 120 sets a next bit memory cell b1_2 of the programming segment SG1 as the target memory cell according to a memory cell order (step S216), and performs, when receiving the increment command ICMD next time (step S213, step S214), a programming operation on the target memory cell b1_2, and the rest can be done in a same manner. When receiving a $5^{th}$ increment command ICMD, the controller 120 performs a programming operation on a $5^{th}$ bit memory cell b1_5 of the programming segment SG1 (as shown in example (a)).

When an $8^{th}$ increment command ICMD, the controller 120 performs the programming operation on an $8^{th}$ bit memory cell b1_8 of the programming segment SG1 (step S213, step S214). Next, the controller 120 determines that the target memory cell b1_8 is a last bit of the programming segment SG1, and the programming segment SG1 is not a last segment (step S215, step S217). Therefore, the controller 120 sets a next segment SG2 as the programming segment according to the segment order, and sets a $1^{st}$ bit memory cell b2_1 of the programming segment SG2 as the target memory cell (step S218), and then performs a programming operation on the memory cells of the programming segment SG2 based on a cycle of step S213-step S216. Therefore, when receiving a $9^{th}$ increment command ICMD, the controller 120 performs the programming operation on the $1^{st}$ bit memory cell b2_1 of the programming segment SG2. Next, when receiving a $10^{th}$ increment command ICMD, the controller 120 performs a programming operation on a $2^{nd}$ bit memory cell b2_2 of the programming segment SG2 (as shown in example (b)), and the rest can be done in a same manner. When receiving a $16^{th}$ increment command ICMD, the controller 120 performs a programming operation on the $8^{th}$ bit memory cell b2_8 of the programming segment SG2 (as shown in example (c)). At this time, the controller 120 determines that the target memory cell b2_8 is a last bit of the programming segment SG2, and the programming segment SG2 is a last segment (step S215, step S217).

Next, the controller 120 updates the base value B, performs an erasing operation on both the segments SG1, SG2 (step S219), and initially resets the programming segment and an address of the programmed target memory cell in the programming segment (step S212), to wait for a next increment command ICMD. Herein, for example, a value of 16 is added to the base value B, and therefore an updated base value B is equal to 16.

Figure 5:
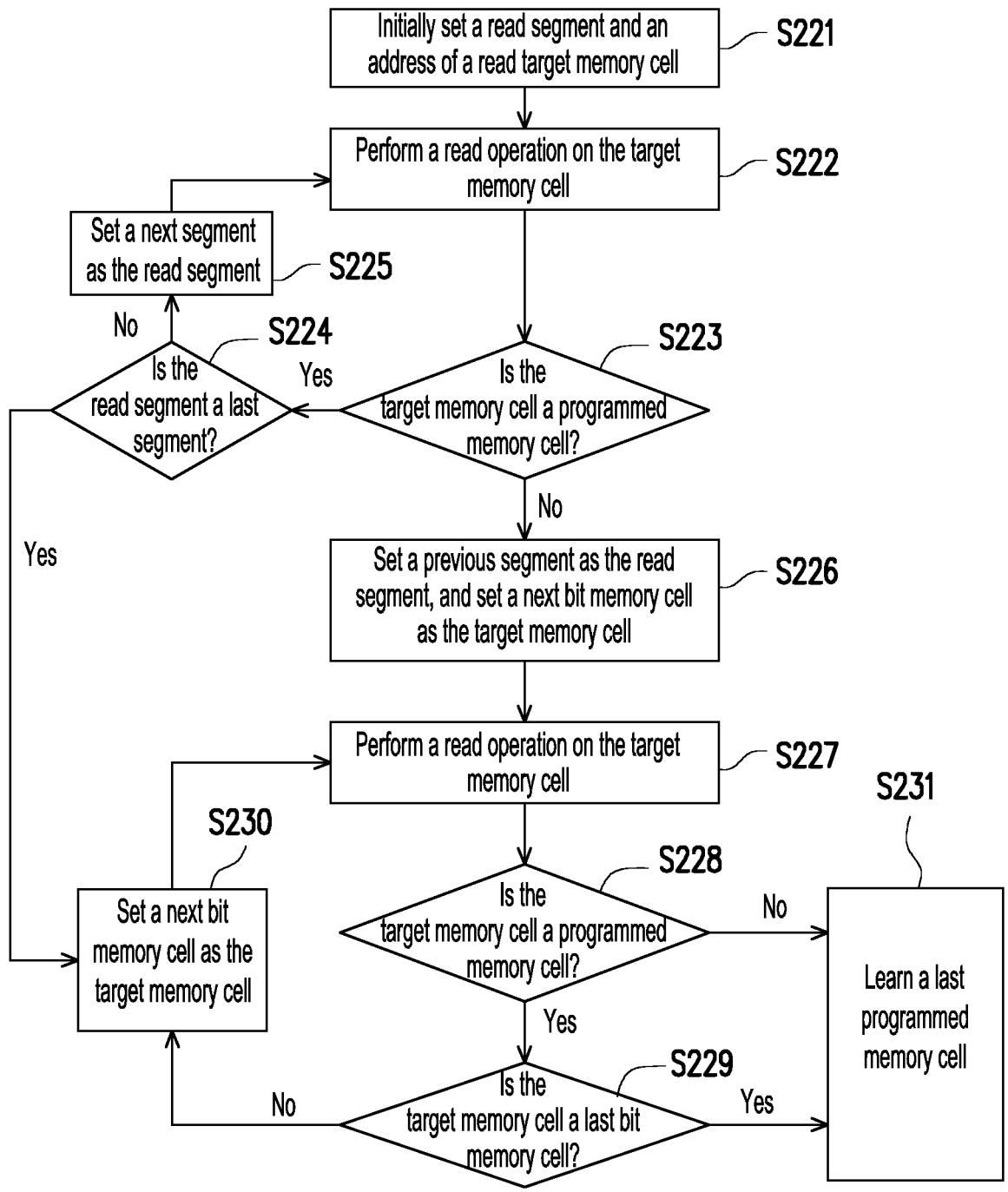
FIG. 5 and FIG. 6 are respectively a method flowchart and a schematic example diagram of read steps of the operating method according to the second embodiment of the invention.

FIG. 5 is a method flowchart of read steps of an operating method according to a second embodiment of the invention. Referring to FIG. 1, FIG. 2, and FIG. 5, read steps of the present embodiment is applicable to step S120 of the first embodiment, and the read steps are started when the controller 120 receives a read command RCMD. In step S221, the controller 120 initially sets a read segment and an address of a read target memory cell in the read segment. In detail, the controller 120 sets a $j^{th}$ segment as the read segment and sets an $i^{th}$ bit memory cell of the read segment as the read target memory cell. Therefore, the controller 120 initially sets values of i and j in step S221. For example, the controller 120 sets a $1^{st}$ segment as the read segment, and initially sets a $1^{st}$ bit memory cell of the read segment as the read target memory cell (that is, it is set that i=1, j=1). Next, the controller 120 performs a read operation on the target memory cell in step S222, and determines whether the target memory cell is the programmed memory cell in step S223. If the target memory cell is the programmed memory cell, the controller 120 determines whether the read segment is a last segment in step S224. If the read segment is not the last segment, the controller 120 sets an $i^{th}$ bit memory cell of a next segment as the target memory cell in step S225, and returns to step S222 to perform the read operation on the target memory cell. In detail, the controller 120 sets the next segment as the read segment according to the segment order in step S225, and sets the $i^{th}$ bit memory cell of the read segment as the target memory cell. For example, it is set that j=j+1 (a value of i is unchanged). In other words, if the controller 120 determines that the target memory cell is the programmed memory cell in step S223, and the read segment is not the last segment in step S224, the controller 120 sets the $i^{th}$ bit memory cell of the next segment as the target memory cell according to an incremental segment order.

In a cycle of step S222-step S225, a value of i is always unchanged (for example, the value keeps at 1 herein). Therefore, the controller 120 reads an $i^{th}$ bit memory cell of each of the segments one by one according to the segment order until the controller 120 finds an unprogrammed $i^{th}$ bit memory cell (step S223—No) or all $i^{th}$ bit memory cells of all segments are programmed memory cells (step S224—Yes).

In addition, if the controller 120 determines that the target memory cell is not the programmed memory cell in step S223, the controller 120 sets a previous segment as the read segment and sets a next bit memory cell of the read segment as the target memory cell in step S226, and performs the read operation on the target memory cell in step S227. In detail, in step S226, the controller 120 sets the previous segment as the read segment according to the segment order, and sets the next bit memory cell as the target memory cell according to the memory cell order. For example, it is set that j=j−1 and i=i+1. In other words, when the controller 120 finds an unprogrammed $i^{th}$ bit memory cell in the cycle of step S222-step S225, the controller 120 then performs the read operation on the next bit memory cell of the previous segment.

Next, the controller 120 determines whether the target memory cell is the programmed memory cell in step S228. If the target memory cell is not the programmed memory cell, the controller 120 learns the last programmed memory cell in step S231. In other words, at this time, the $(i-1)^{th}$ bit memory cell of the $j^{th}$ segment is the last programmed memory cell.

If the controller 120 determines that the target memory cell is the programmed memory cell in step S228, the controller 120 determines whether the target memory cell is the last bit memory cell of the read segment in step S229. If the target memory cell is the last bit memory cell of the read segment, the controller 120 further learns the last programmed memory cell in step S231. In other words, at this time, the $i^{th}$ bit memory cell of the $j^{th}$ segment is the last programmed memory cell.

In addition, if the controller 120 determines that the target memory cell is not the last bit memory cell of the read segment in step S229, the controller 120 sets a next bit memory cell as the target memory cell in step S230. In detail, in step S230, the controller 120 sets the next bit memory cell of the read segment as the target memory cell according to the memory cell order, for example, it is set that i=i+1 (the value of j is unchanged). Next, the controller 120 returns to step S227 to continue to perform a read operation on the target memory cell. In addition, when the controller 120 determines that the read segment is the last segment in step S224, the controller 120 performs step S230.

It can be learned from this that in the present embodiment, based on step S226-step S231, the controller 120 reads a plurality of memory cells of the previous segment according to the segment order and the memory cell order. Next, the controller 120 learns a last programmed memory cell according to a determining result that an unprogrammed memory cell is read first in the segment and a determining result that a plurality of cells of the segment are programmed.

Figure 6:
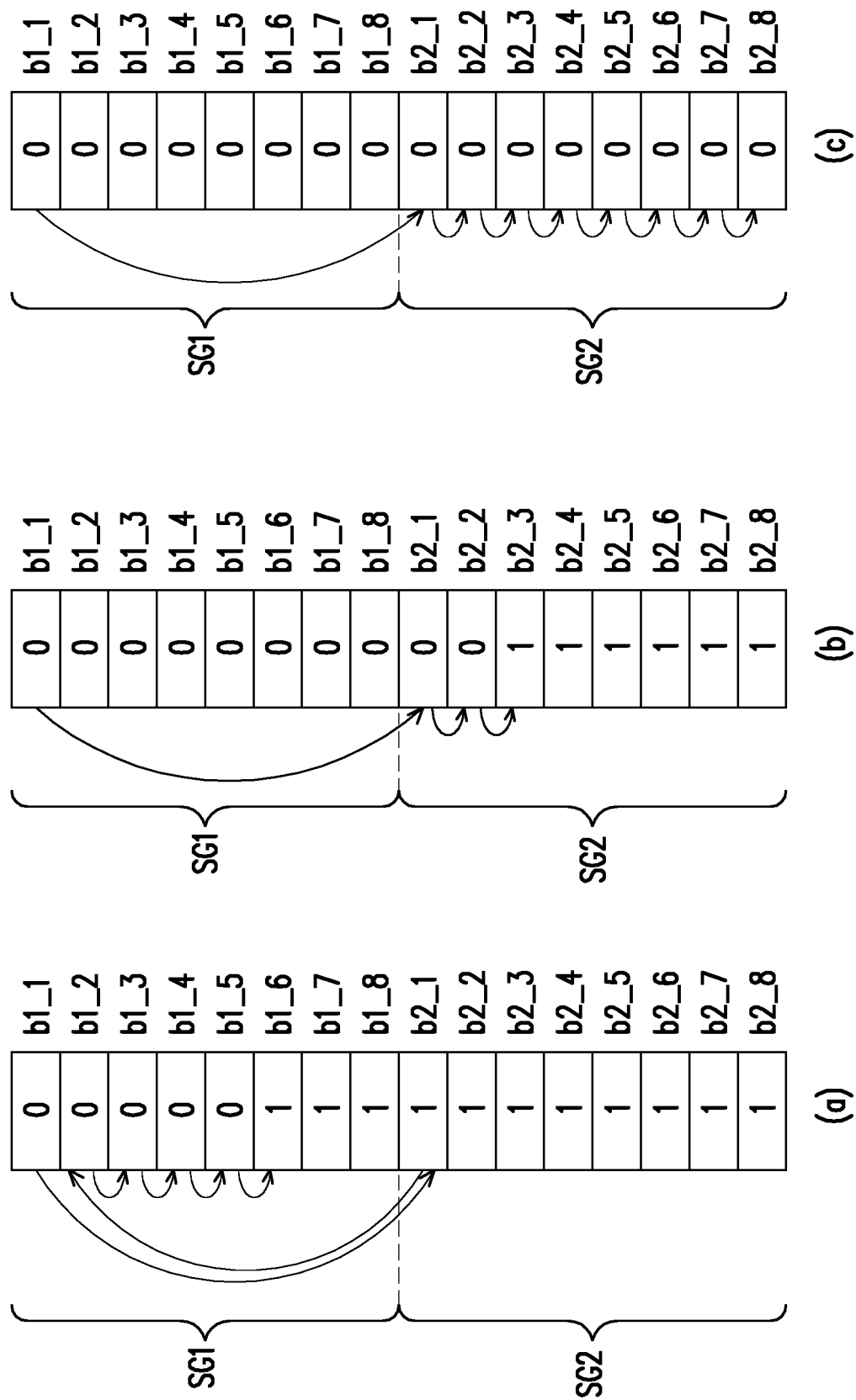

FIG. 6 is a schematic example diagram of read steps of an operating method according to the second embodiment of the invention. In an example of FIG. 6, for example, programming results of example (a)-example (c) of FIG. 4 are read.

Referring to FIG. 1 to FIG. 2 and FIG. 4 to FIG. 6, when a programming result of the example (a) is read, first, the controller 120 sets a $1^{st}$ segment SG1 as a read segment, and sets a $1^{st}$ bit memory cell b1_1 of the read segment SG1 as a read target memory cell, and performs a read operation on the target memory cell b1_1 (step S221, step S222). Next, the controller 120 determines that the target memory cell b1_1 is the programmed memory cell, and the read segment SG1 is not a last segment (step S223, step S224). Therefore, the controller 120 sets a next segment SG2 as the read segment according to the segment order, sets a $1^{st}$ bit memory cell b2_1 of the read segment SG2 as the target memory cell, and continues to perform a read operation on the target memory cell b2_1 (step 225, step S222). Next, the controller 120 determines that the target memory cell b2_1 is not the programmed memory cell (step S223). Therefore, the controller 120 sets a previous segment SG1 as the read segment according to the segment order, sets a next bit memory cell b1_2 of the read segment SG1 as the target memory cell, and continues to perform the read operation on the target memory cell b1_2 (step S226, step S227). Next, the controller 120 determines that the target memory cell b1_2 is the programmed memory cell, and the target memory cell b1_2 is not a last bit memory cell of the read segment SG1 (step S228, step S229). Therefore, the controller 120 sets a next bit memory cell b1_3 of the read segment SG1 as the target memory cell according to the memory cell order, and continues to perform the read operation on the target memory cell b1_3 (step S230, step S227), and the rest can be done in a same manner. When the controller 120 reads the target memory cell b1_6, the controller 120 determines that the target memory cell b1_6 is not the programmed memory cell (step S227, step S228). Therefore, the controller 120 learns that a previous bit memory cell b1_5 of the read segment SG1 at this time is a last programmed memory cell (step S231). In an example (a), the controller 120 may learn that the memory cell b1_5 is the last programmed memory cell after seven read operations.

When a programming result of an example (b) is read, first, the controller 120 sets the $1^{st}$ segment SG1 as a read segment, sets a $1^{st}$ bit memory cell b1_1 of the read segment SG1 as a read target memory cell, and performs a read operation on the target memory cell b1_1 (steps S221, S222). Next, the controller 120 determines that the target memory cell b1_1 is the programmed memory cell, and the read segment SG1 is not a last segment (step S223, step S224). Therefore, the controller 120 sets a next segment SG2 as the read segment according to the segment order, sets a $1^{st}$ bit memory cell b2_1 of the read segment SG2 as the target memory cell, and continues to perform a read operation on the target memory cell b2_1 (step 225, step S222). Next, the controller 120 determines that the target memory cell b2_1 is the programmed memory cell, and the read segment SG2 is the last segment (step S223, step S224). Therefore, the controller 120 sets a next bit memory cell b2_2 of the read segment SG2 as the target memory cell according to the memory cell order, and continues to perform the read operation on the target memory cell b2_2 (step S230, step S227). Next, the controller 120 determines that the target memory cell b2_2 is the programmed memory cell, and the target memory cell b2_2 is not a last bit memory cell of a $2^{nd}$ segment (step S228, step S229). Therefore, the controller 120 sets a next bit memory cell b2_3 of the read segment SG2 as the target memory cell according to the memory cell order, and continues to perform the read operation on the target memory cell b2_3 (step S230, step S227). Next, the controller 120 determines that the target memory cell b2_3 is not the programmed memory cell. Therefore, the controller learns that the previous bit memory cell b2_2 at this time is the last programmed memory cell (step S228, step S231). In the example (b), the controller 120 may learn that the memory cell b2_2 is the last programmed memory cell after four read operations.

When a programming result of an example (c) is read, first, the controller 120 sets a $1^{st}$ segment SG1 as a read segment, sets a $1^{st}$ bit memory cell b1_1 of the read segment SG1 as a read target memory cell, and performs a read operation on a target memory cell b1_1 (step S221, step S222). Next, the controller 120 determines that the target memory cell b1_1 is the programmed memory cell, and the read segment SG1 is not a last segment (step S223, step S224). Therefore, the controller 120 sets a next segment SG2 as the read segment according to the segment order, sets a $1^{st}$ bit memory cell b2_1 of the read segment SG2 as the target memory cell, and continues to perform a read operation on the target memory cell b2_1 (step 225, step S222). Next, the controller 120 determines that the target memory cell b2_1 is the programmed memory cell, and the read segment SG2 is the last segment (step S223, step S224). Therefore, the controller 120 sets a next bit memory cell b2_2 of the read segment SG2 as the target memory cell according to the memory cell order, and continues to perform the read operation on the target memory cell b2_2 (step S230, step S227). Next, the controller 120 determines that the target memory cell b2_2 is the programmed memory cell, and the target memory cell b2_2 is not a last bit memory cell of a $2^{nd}$ segment (step S228, step S229). Therefore, the controller 120 sets a next bit memory cell b2_3 of the read segment SG2 as the target memory cell according to the memory cell order, and continues to perform the read operation on the target memory cell b2_3 (step S230, step S227), and rest can be done in a same manner. When the controller 120 reads a target memory cell b2_8, the controller 120 determines that the target memory cell b2_8 is a programmed memory cell (step S227, step S228), then the controller 120 determines that the target memory cell b2_8 is a last bit memory cell of a read segment SG2. Therefore, the controller learns that the target memory cell b2_8 at this time is a last programmed memory cell (step S231). In the example (c), the controller 120 may learn that the memory cell b2_8 is the last programmed memory cell after nine read operations.

Still referring to FIG. 1 to FIG. 2 and FIG. 4 to FIG. 6, when the last programmed memory cell is learned, the controller 120 calculates, according to a base value B and an address of the last programmed memory cell, a replay-protected monotonic count value RS associated with a number of increment commands ICMD in step S130 of FIG. 1. For example, in the example (b) of the second embodiment, the last programmed memory cell is the memory cell b2_2. It may be learned based on the memory cell b2_2 that all memory cells b1_1-b1_8 of a $1^{st}$ segment SG1 and the memory cells b2_1-b2_2 of a $2^{nd}$ segment SG2 are programmed in the example. Because the number of the increment commands ICMD is equal to a sum of a number of bits (that is, 10) and a base value (that is, 0) of all programmed memory cells, and the replay-protected monotonic count value RS is equal to the number of the increment commands ICMD. Therefore, the replay-protected monotonic count value RS is equal to 10.

Figure 7:
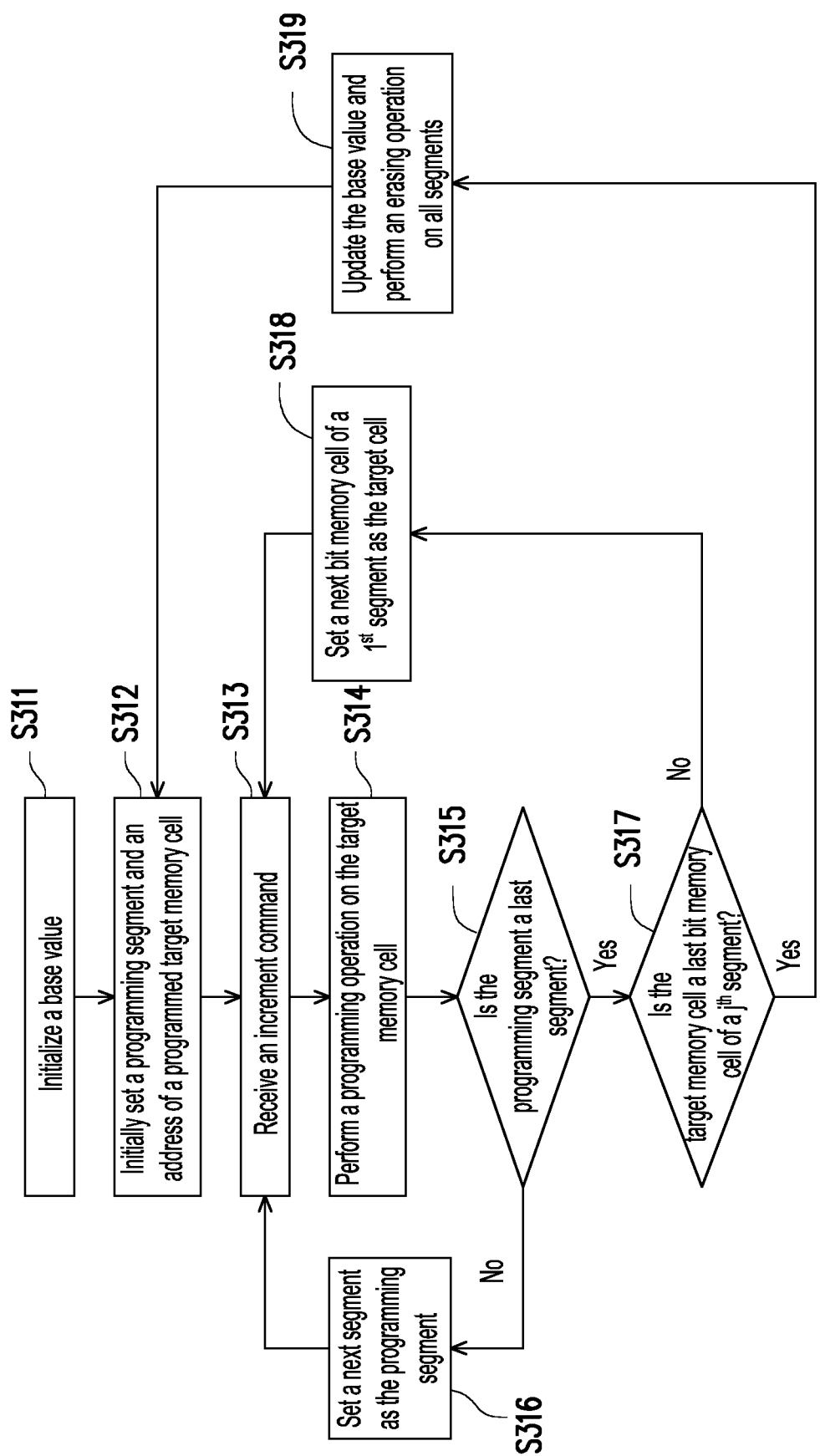
FIG. 7 and FIG. 8 are respectively a method flowchart and a schematic example diagram of programming steps of an operating method according to a third embodiment of the invention.

FIG. 7 is a method flowchart of programming steps of an operating method according to a third embodiment of the invention. Referring to FIG. 1, FIG. 2, and FIG. 7, the programming steps of the present embodiment is applicable to step S110 of a first embodiment. For step S311 to step S314 in the present embodiment, reference may be made to related descriptions of step S211 to step S214 in the second embodiment, and the descriptions thereof are omitted herein.

Following step S314, in step S315, the controller 120 determines whether the programming segment is a last segment. If the programming segment is not the last segment, the controller 120 sets a next segment as a read segment in step 316, sets an $i^{th}$ bit memory cell of the read segment as a target memory cell, and returns to step S313 to wait for a next increment command ICMD. In detail, the controller 120 sets the next segment as the programming segment according to the segment order in step S316, and sets the $i^{th}$ bit memory cell of the programming segment as the target memory cell, for example, it is set that j=j+1 (a value of i is unchanged). In other words, in the present embodiment, the controller S120 performs a programming operation on $i^{th}$ bit memory cells of all segments in an incremental segment order based on a cycle of step S313-step S316.

In addition, in step S315, if the programming segment is the last segment, it means that the $i^{th}$ bit memory cell of all segments is programmed. At this time, the controller 120 determines whether the target memory cell is a last bit memory cell of the programming segment in step S317. If the target memory cell is not the last bit memory cell, the controller 120 sets a next bit memory cell of the $1^{st}$ segment as the target memory cell in step S318, and returns to step S313 to wait for a next increment command ICMD. In detail, in step S318, the controller 120 sets the $1^{st}$ segment as the programming segment according to the segment order, and sets the next bit memory cell as the target memory cell according to the memory cell order, for example, it is set that j=1 and i=i+1. In other words, in the present embodiment, after $i^{th}$ bit memory cells of all segments SG1-SGN are programmed, the controller 120 then performs a programming operation on next bit memory cells of all segments based on a cycle of step S313-step S316.

In addition, in step S317, if the target memory cell is the last bit memory cell of the programming segment, the controller 120 updates a base value B in step S319 and performs an erasing operation on the memory cells of all segments SG1-SGN. For step S319 in the present embodiment, reference may be made to relevant description of step S219 in the second embodiment, and the descriptions thereof are omitted herein.

Figure 8:
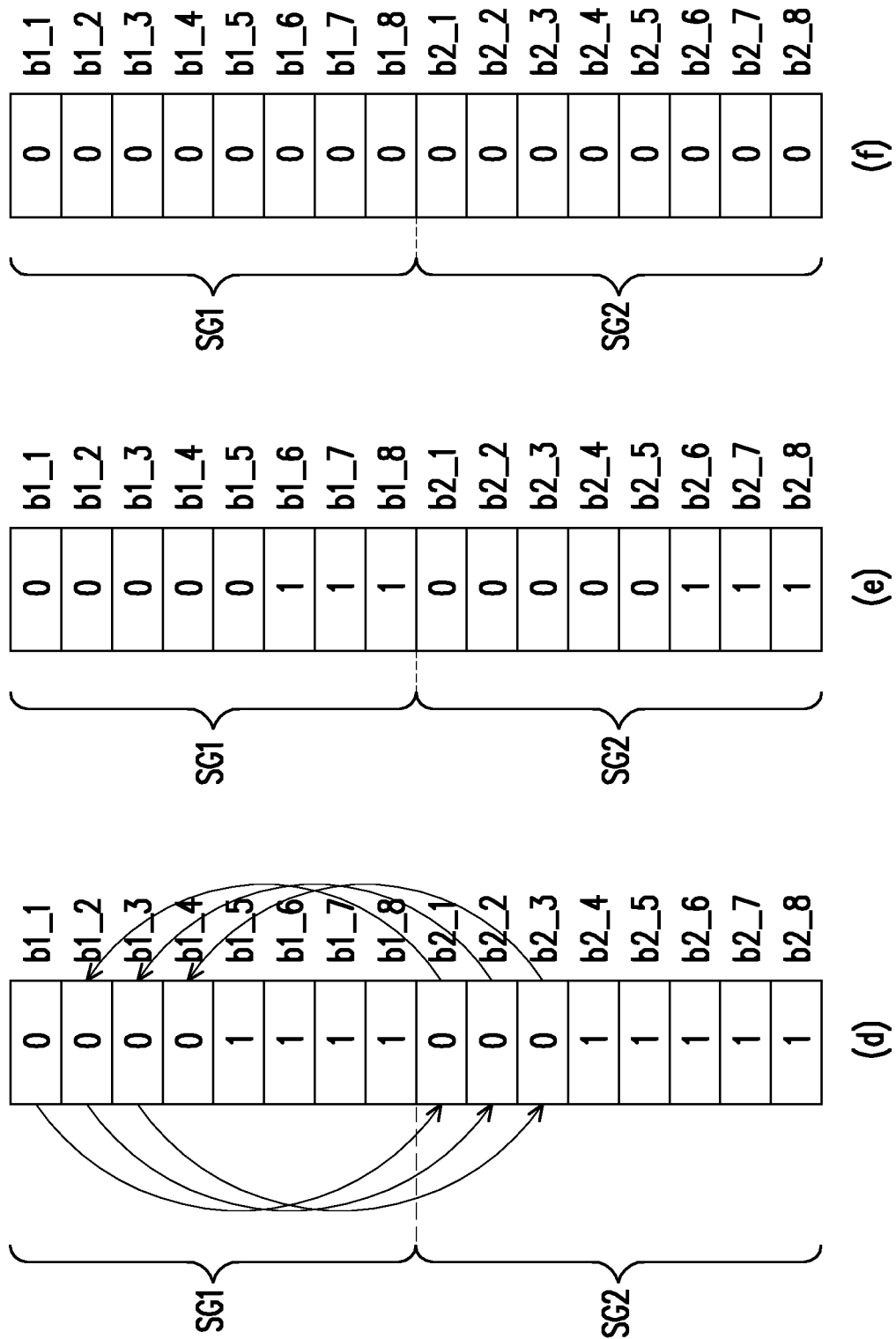

FIG. 8 is a schematic example diagram of programming steps of an operating method according to a third embodiment of the invention. In FIG. 8, for example, two segments SG1 and SG2 each include eight memory cells. The segment SG1 includes memory cells b1_1-b1_8. The segment SG2 includes memory cells b2_1-b2_8. An example (d) is a programming result that seven increment commands ICMD are received. An example (e) is a programming result that ten increment commands ICMD are received.

Referring to FIG. 2, FIG. 7, and FIG. 8, first, a controller 120 sets a base value B to 0, sets a $1^{st}$ segment to a programming segment, and sets a $1^{st}$ bit memory cell b1_1 of the programming segment SG1 to a programmed target memory cell (step S311, step S312). When receiving an increment command ICMD, the controller 120 performs a programming operation on the target memory cell b1_1 (step S313, step S314). Next, the controller 120 determines that the programming segment SG1 is not a last segment (step S315). Therefore, the controller 120 sets a next segment SG2 as a programming segment according to the segment order, and sets a $1^{st}$ bit memory cell b2_1 of the programming segment SG2 as a target memory cell (step S316), and performing, when receiving a next increment command ICMD, a programming operation on the target memory cell b2_1 (step S313, step S314). Next, the controller 120 determines that the read segment SG2 is the last segment, and determines that the target memory cell is not a last bit memory cell (step S315, step S317). Therefore, the controller 120 sets the $1^{st}$ segment as the programming segment, and sets a next bit memory cell b1_2 of the programming segment as a target memory cell (step S318). When receiving the increment command ICMD again, the controller 120 performs a programming operation on the target memory cell b1_2 (step S313, step S314), and the rest can be done in a same manner. When receiving a $7^{th}$ increment command ICMD, the controller 120 performs a programming operation on a $4^{th}$ bit memory cell b1_4 of the $1^{st}$ segment SG1 (step S313, step S314, at this time, performing of the programming operation on the memory cells b2_2, b1_3, b2_3 is completed, as shown in the example (d)). When receiving a $10^{th}$ increment ICMD, the controller 120 performs a programming operation on a $5^{th}$ bit memory cell b2_5 of the $2^{nd}$ segment SG2 (step S313, step S314, at this time, performing of the programming operation on the memory cells b2_4 and b1_5 is completed, as shown in the example (e)). When receiving a $16^{th}$ increment command ICMD, the controller 120 performs a programming operation on an $8^{th}$ bit memory cell b2_8 of the $2^{nd}$ segment SG2 (step S313, step S314, at this time, performing of the programming operation on the memory cells b1_6, b2_6, b1_7, b2_7, b1_8 is completed, as shown in an example (O).

Figure 9:
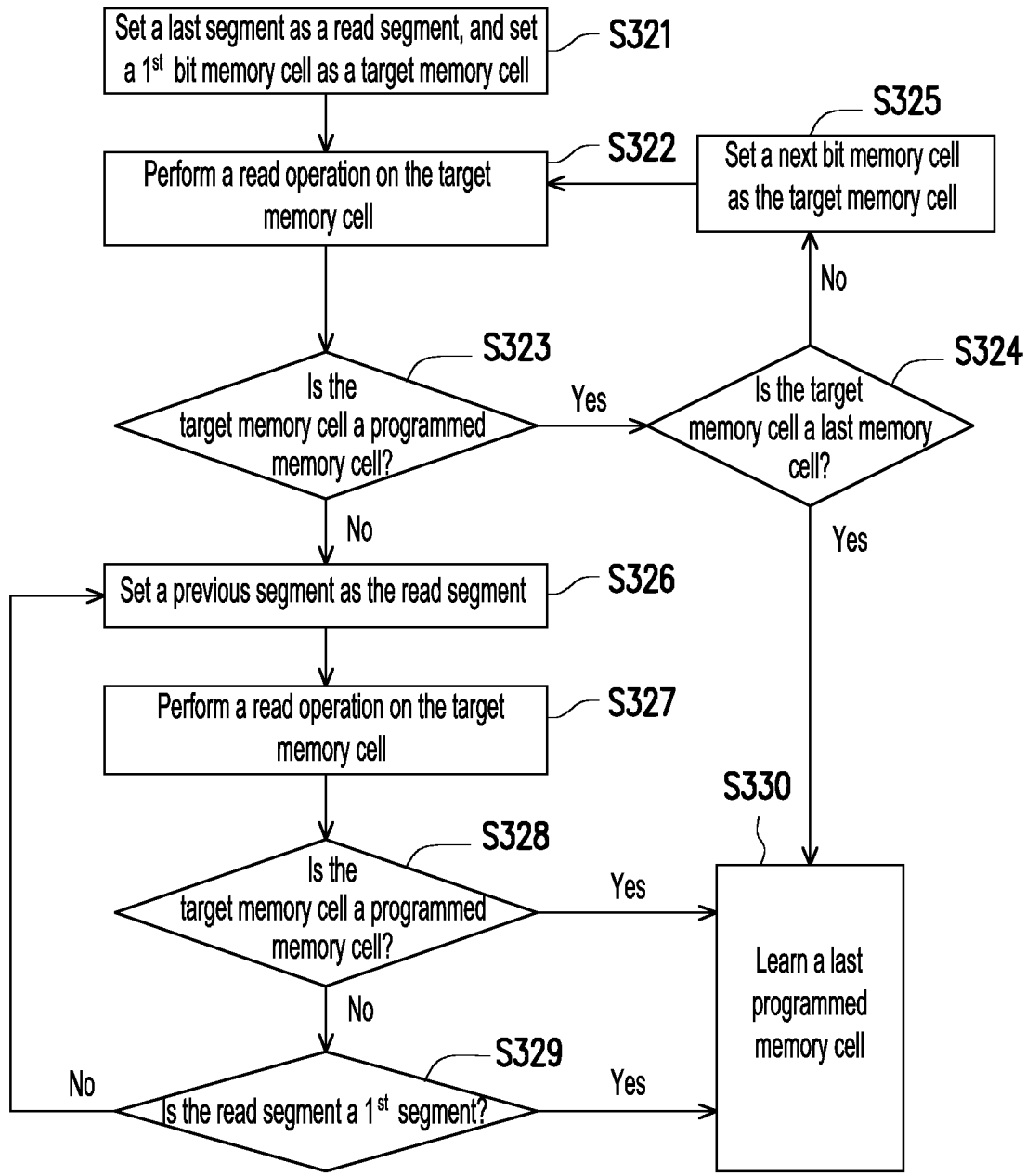
FIG. 9 and FIG. 10 are respectively a method flowchart and a schematic example diagram of read steps of the operating method according to the third embodiment of the invention.

FIG. 9 is a method flowchart of read steps of an operating method according to a third embodiment of the invention. Referring to FIG. 1, FIG. 2, and FIG. 9, read steps of the present embodiment is applicable to step S120 of the first embodiment, and the read steps are started when the controller 120 receives a read command RCMD. In step S321, the controller 120 initially sets a read segment and an address of a read target memory cell in the read segment. In detail, the controller 120 sets a $j^{th}$ segment as the read segment, and sets an $i^{th}$ bit memory cell of the read segment as the read target memory cell. Therefore, the controller 120 initially sets values of i and j in step S321. For example, the controller 120 sets a last segment as the read segment, and initially sets a $1^{st}$ bit memory cell of the read segment as the read target memory cell (that is, it is set that i=1, j=N). Next, the controller 120 performs a read operation on the target memory cell in step S322, and determines, in step S323, whether the target memory cell is the programmed memory cell. If the target memory cell is the programmed memory cell, the controller 120 determines, in step S324, whether the target memory cell is a last bit memory cell of the read segment. If the target memory cell is not the last bit memory cell of the read segment, the controller sets a next bit memory cell as the target memory cell in step S325, and returns to step S322 to perform a read operation on the target memory cell. In detail, in step S325, the controller 120 sets the next bit memory cell of the read segment as the target memory cell according to the memory cell order, for example, it is set that i=i+1 (a value of j is unchanged).

If the controller 120 determines that the target memory cell is not the programmed memory cell in step S323, the controller 120 sets an $i^{th}$ bit memory cell of a previous segment as the target memory cell in step S326, and performs the read operation on the target memory cell in step S327. In detail, the controller 120 sets a previous segment as the read segment according to the segment order in step S326, and sets the $i^{th}$ bit memory cell of the read segment as the target memory cell, for example, it is set that j=j−1 (a value of i is unchanged). In other words, when the controller 120 finds an unprogrammed $i^{th}$ bit memory cell in a cycle of step S322-step S325, the controller 120 performs the read operation on the $i^{th}$ bit memory cell of the previous segment.

Next, the controller 120 determines whether the target memory cell is the programmed memory cell in step S328. If the target memory cell is the programmed memory cell, the controller 120 learns the last programmed memory cell in step S330. In other words, at this time, the $i^{th}$ bit memory cell of the $j^{th}$ segment is the last programmed memory cell.

However, when the controller 120 determines, in step S328, that the target memory cell is not the programmed memory cell, the controller 120 determines, in step S329, whether the read segment is the $1^{st}$ segment. If the read segment is not the $1^{st}$ segment, the controller 120 returns to step S326 and then sets a previous segment as the read segment, sets an $i^{th}$ bit memory cell of the read segment as the target memory cell, and performs, in S327, a read operation on the target memory cell.

In addition, if the controller 120 determines, in step S329, that the read segment is the $1^{st}$ segment, the controller 120 further learns the last programmed memory cell in step S330. In other words, because it is determined in step S326-step S329 that $i^{th}$ bit memory cells of all segments are not programmed, it may be learned according to the read results of step S321-step S325 that an $i-1^{th}$ bit of the last segment is the last programmed memory cell.

In addition, in step S324, if the controller 120 determines that the target memory cell is a last bit memory cell, it means that memory cells of all segments are programmed, and therefore the last programmed memory cell is also learned in step S330. In other words, the last bit memory cell of the last segment is the last programmed memory cell.

It may be learned that in the present embodiment, the controller 120 first reads a memory cell in a last segment (that is, an $N^{th}$ segment SGN) one by one according to the memory cell order in step S322 to step S325. Afterwards, when the controller 120 reads an unprogrammed $i^{th}$ bit memory cell for the first time in the last segment, the controller 120 reads an $i^{th}$ bit memory cell of each segment one by one according to a decremental segment order in step S326 to step S329. Next, the controller 120 learns the last programmed memory cell according to a determining result (step S328—Yes) that a programmed $i^{th}$ bit memory cell is read for the first time, a determining result (step S329—Yes) that $i^{th}$ bit memory cells of all segments are not programmed, and a determining result (step S324—Yes) that memory cells of all segments are programmed.

Figure 10:
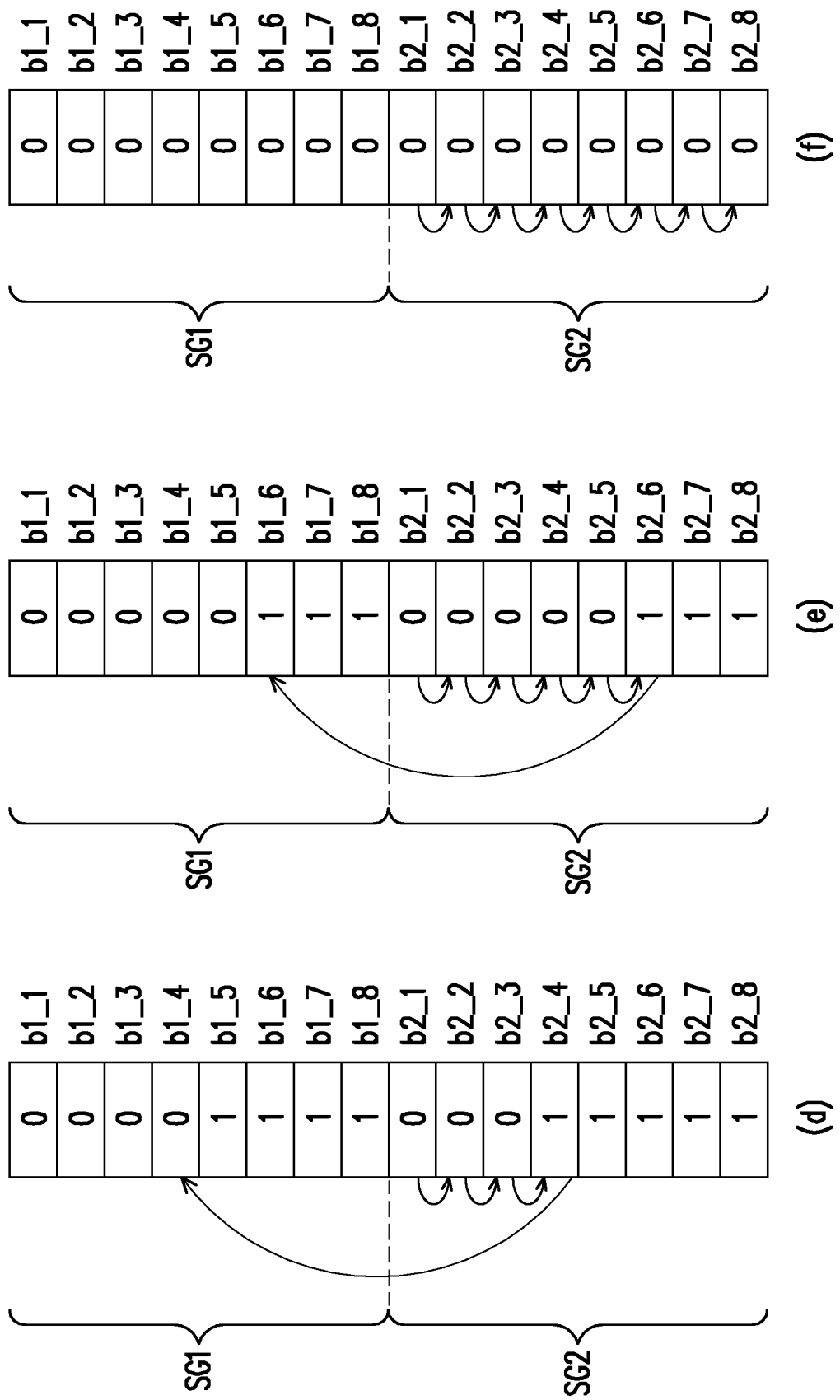

FIG. 10 is a schematic diagram of an example of read steps of an operating method according to a third embodiment of the invention. In the example of FIG. 10, programming results of example (d) to example (f) of FIG. 8 are read.

Referring to FIG. 1 to FIG. 2 and FIG. 8 to FIG. 10, when a programming result of the example (d) is read, first, the controller 120 sets a last segment SG2 as a read segment, sets a 1st bit memory cell b2_1 of the read segment SG2 as a read target memory cell, and performs a read operation on the target memory cell b2_1 (step S321, step S322). Next, the controller 120 determines that the target memory cell b2_1 is a programmed memory cell, and the target memory cell b2_1 is not a last bit memory cell of a last segment (step S323, step S324). Therefore, the controller 120 sets a next bit memory cell b2_2 of the read segment SG2 as the target memory cell according to the memory cell order, and continues to perform the read operation on the target memory cell b2_2 (step S325, step S322), and the rest can be done in a same manner. When a $4^{th}$ bit memory cell b2_4 of the last segment SG2 is read, the controller 120 determines that the target memory cell b2_4 is not the programmed memory cell (step S322, step S323). Next, the controller 120 sets a $4^{th}$ bit memory cell b1_4 of a previous segment SG1 as the target memory cell, and continues to perform a read operation on the target memory cell b1_4 (step S326, step S327). Next, the controller 120 determines that the target memory cell b1_4 is a programmed memory cell. Therefore, the controller learns that the target memory cell b1_4 is a last programmed memory cell (step S328, step S330). In the example (d), the controller 120 may learn that the memory cell b1_4 is the last programmed memory cell after five read operations.

When a programming result of the example (e) is read, first, the controller 120 sets a last segment SG2 as a read segment, and sets a $1^{st}$ bit memory cell b2_1 of the read segment SG2 as a read target memory cell, and performs a read operation on the target memory cell b2_1 (step S321, step S322). Next, the controller 120 determines that the target memory cell b2_1 is a programmed memory cell, and the target memory cell b2_1 is not a last bit memory cell of a last segment (step S323, step S324). Therefore, the controller 120 sets a next bit memory cell b2_2 of the read segment SG2 as the target memory cell according to the memory cell order, and continues to perform the read operation on the target memory cell b2_2 (step S325, step S322), and the rest can be done in a same manner. When a $6^{th}$ bit memory cell b2_6 of the last segment SG2 is read, the controller 120 determines that the target memory cell b2_6 is not the programmed memory cell (step S322, step S323). Next, the controller 120 sets a previous segment SG1 as a read segment, sets a $6^{th}$ bit memory cell b1_6 of the read segment SG1 as the target memory cell, and continues to perform the read operation on the target memory cell b1_6 (step S326, step S327). Next, the controller 120 determines that the target memory cell b1_6 is not a programmed memory cell, and the segment SG1 at this time is the $1^{st}$ segment (step S328, step S329). Therefore, the controller learns that the memory cell b2_5 is a last programmed memory cell (step S330). In the example (e), the controller 120 may learn that the memory cell b2_5 is the last programmed memory cell after seven read operations.

When a programming result of an example (f) is read, first, the controller 120 sets a last segment SG2 as a read segment, and sets a $1^{st}$ bit memory cell b2_1 of the read segment SG2 as a read target memory cell, and performs a read operation on the target memory cell b2_1 (step S321, step S322). Next, the controller 120 determines that the target memory cell b2_1 is a programmed memory cell, and the target memory cell b2_1 is not a last bit memory cell of a last segment (step S323, step S324). Therefore, the controller 120 sets a next bit memory cell b2_2 of the read segment SG2 as the target memory cell according to the memory cell order, and continues to perform the read operation on the target memory cell b2_2 (step S325, step S322), and the rest can be done in a same manner. When an $8^{th}$ bit memory cell b2_8 of a last segment SG2 is read (step S322), the controller 120 determines that the target memory cell b2_8 is a programmed memory cell, and the target memory cell b2_8 is the last bit memory cell of the last segment (step S323, step S324). Therefore, the controller learns that the target memory cell b2_8 is a last programmed memory cell (step S330). In the example (f), the controller 120 may learn that the memory cell b2_8 is the last programmed memory cell after eight read operations.

Returning to the embodiments of FIG. 1 and FIG. 2, when learning the last programmed memory cell, the controller 120 calculates, according to the base value B and the address of the last programmed memory cell in step S130 of FIG. 1, the replay-protected monotonic count value RS associated with a number of increment commands ICMD. In an embodiment, the replay-protected monotonic count value RS is equal to a sum of a number of programmed memory cells and the base value B in all segments SG1-SGN. For example, in the example (e) of the third embodiment, the last programmed memory cell is a $5^{th}$ memory cell b2_5 of a second segment SG2. According to the programming method of FIG. 7, the controller 120 may learn that the number of programmed memory cells in all segments SG1-SG2 is equal to 10. Because the base value in the example is 0, the replay-protected monotonic count value RS is equal to 10.

Next, according to Table 1, a comparison result of numbers of read operations in a comparison example, and the second embodiment and the third embodiment of the invention are summarized. The comparison example has 16 memory cells the same as the second embodiment and the third embodiment of the invention. In the comparison example, when the non-volatile memory receives a programming command and a read command, a memory cell is not planned as an example of a plurality of segments. Therefore, the comparison example simply performs a programming operation on memory cells according to a memory cell order, and performs a read operation on the memory cells according to the memory cell order. In order to learn the replay-protected monotonic count value, a number of read operations required in the comparison example is greater than or equal to a number of increment instructions.

TABLE 1

| | A number of performed read operations | | |
|---|---|---|---|
| | Comparison example | Second embodiment | Third embodiment |
| 1 | 2 | 3 | 2 |
| 2 | 3 | 4 | 3 |

TABLE 1-continued

| | A number of performed read operations | | |
|---|---|---|---|
| | Comparison example | Second embodiment | Third embodiment |
| 3 | 4 | 5 | 3 |
| 4 | 5 | 6 | 4 |
| 5 | 6 | 7 | 4 |
| 6 | 7 | 8 | 5 |
| 7 | 8 | 9 | 5 |
| 8 | 9 | 9 | 6 |
| 9 | 10 | 3 | 6 |
| 10 | 11 | 4 | 7 |
| 11 | 12 | 5 | 7 |
| 12 | 13 | 6 | 8 |
| 13 | 14 | 7 | 8 |
| 14 | 15 | 8 | 9 |
| 15 | 16 | 9 | 9 |
| 16 | 16 | 9 | 8 |
| Average number | 9.4 | 6.4 | 5.9 |

It may be learned from the result in Table 1 that when the programming operation and the read operation are performed in a case that the non-volatile memory is planned as a plurality of segments, the replay-protected monotonic count value may be learned through less read operations in the second embodiment and the third embodiment. If there is a larger a space of the non-volatile memory and a greater number of segments, the effect of accelerating the learning of the replay-protected monotonic count value will be more significant in the second embodiment and the third embodiment.

Based on the foregoing, according to the invention, the programming operation is performed multiple times on the memory cells of the plurality of segments according to the segment order and the memory cell order. According to the invention, the read operation is performed multiple times according to the segment order and the memory cell order to learn the last programmed memory cell. In addition, according to the invention, the replay-protected monotonic count value associated with the number of increment commands is calculated according to the information about the last programmed memory cell. In this way, the learning of the replay-protected monotonic count value can be accelerated.

Although the invention has been described above by using the embodiments, the embodiments are not intended to limit the invention. A person of ordinary skill in the art may make variations and improvements without departing from the spirit and scope of the invention. Therefore, the protection scope of the invention should be subject to the appended claims.

What is claimed is:

1. An operating method adapted for controlling a non-volatile memory, wherein the non-volatile memory comprises a plurality of segments arranged in a segment order, a plurality of memory cells of each of the segments are arranged in a same memory cell order, and the operating method comprises:
    performing a programming operation multiple times on the memory cells of the segments in sequence according to a plurality of increment commands, the segment order, and the memory cell order;
    performing, when receiving a read command, a read operation multiple times according to the segment order and the memory cell order until a last programmed memory cell is learned; and
    calculating, according to an address of the last programmed memory cell, a replay-protected monotonic count value associated with a number of the increment commands.

2. The operating method according to claim 1, further comprising:
    performing, when receiving one of the increment commands, the programming operation once on one of the segments according to the increment command.

3. The operating method according to claim 1, wherein the step of performing the programming operation multiple times on the memory cells of the segments in sequence further comprises:
    when the plurality of memory cells of the segments are all programmed, setting a base value, and performing an erasing operation on the segments.

4. The operating method according to claim 3, wherein the step of calculating, according to the address of the last programmed memory cell, the replay-protected monotonic count value associated with the number of the increment commands comprises:
    calculating, according to the base value and the address of the last programmed memory cell, the replay-protected monotonic count value associated with the number of the increment commands.

5. The operating method according to claim 1, wherein the step of performing the programming operation multiple times on the memory cells of the segments in sequence comprises:
    performing the programming operation on a plurality of memory cells of a first segment of the segments according to the memory cell order;
    selecting, when all of the memory cells of the first segment are programmed, a second segment of the segments according to the segment order; and
    performing the programming operation on a plurality of memory cells of the second segment according to the memory cell order.

6. The operating method according to claim 5, wherein the step of performing the read operation multiple times according to the segment order and the memory cell order until the last programmed memory cell is learned comprises:
    using one of the segments as a read segment one by one according to the segment order, and reading a first bit memory cell of the read segment to determine whether the read segment has a programmed first bit memory cell; and
    when determining that the read segment of the segments has the programmed first bit memory cell and the read segment is not a last segment, using a next segment as the read segment according to the segment order to read a first bit memory cell of the read segment.

7. The operating method according to claim 6, wherein the step of performing the read operation multiple times according to the segment order and the memory cell order until the last programmed memory cell is learned further comprises:
    when determining that the read segment does not have the programmed first bit memory cell, using a previous segment as the read segment according to the segment order, and reading a plurality of memory cells of the read segment one by one from a second bit memory cell of the read segment according to the memory cell order; and
    learning the last programmed memory cell according to one of a determining result that an unprogrammed memory cell is read from the read segment for the first time and a determining result that a plurality of memory cells of the read segment are all programmed.

8. The operating method according to claim 1, wherein the step of performing the programming operation multiple times on the memory cells of the segments in sequence comprises:
performing the programming operation on a first bit memory cell of each of the segments according to the segment order; and
performing, after the first bit memory cell of each of the segments is programmed, the programming operation on a second bit memory cell of each of the segments according to the segment order and the memory cell order.

9. The operating method according to claim 8, wherein the step of performing the read operation multiple times according to the segment order and the memory cell order until the last programmed memory cell is learned comprises:
using a last segment of the segments as a read segment;
reading a plurality of memory cells of the read segment one by one from the first bit memory cell of the read segment according to the memory cell order to determine whether the memory cells of the read segment are programmed; and
when determining that an $i^{th}$ bit memory cell of the read segment is not programmed, using a previous segment as the read segment according to the segment order, and reading an $i^{th}$ bit memory cell of the read segment to determine whether the $i^{th}$ bit memory cell of the read segment is programmed, wherein i is a positive integer greater than 0.

10. The operating method according to claim 9, wherein the step of performing the read operation multiple times according to the segment order and the memory cell order until the last programmed memory cell is learned further comprises:
learning the last programmed memory cell according to one of the following conditions:
it is determined that a read memory cell is a last bit memory cell of the last segment;
it is determined that the read memory cell is a programmed memory cell of a segment other than the last segment; and
it is determined that the read segment is a first segment of the segments.

11. A memory device adapted for a replay-protected monotonic counter and comprising:
a non-volatile memory comprising a plurality of segments, wherein the segments are arranged in a segment order, and a plurality of memory cells of each of the segments are arranged in a same memory cell order; and
a controller coupled to the non-volatile memory and configured to:
receive a plurality of increment commands, and perform a programming operation multiple times on the memory cells of the segments in sequence according to the increment command, the segment order, and the memory cell order,
perform, when receiving a read command, a read operation multiple times according to the segment order and the memory cell order until a last programmed memory cell is learned, and
calculate, according to an address of the last programmed memory cell, a replay-protected monotonic count value associated with a number of the increment commands.

12. The memory device according to claim 11, wherein the controller is further configured to perform, when receiving one of the increment commands, the programming operation once on one of the segments according to the increment command.

13. The memory device according to claim 11, wherein the controller is further configured to: when the plurality of memory cells of the segments are all programmed, set a base value and perform an erasing operation on the segments.

14. The memory device according to claim 13, wherein the controller is further configured to calculate, according to the base value and the address of the last programmed memory cell, the replay-protected monotonic count value associated with the number of the increment commands.

15. The memory device according to claim 11, wherein the controller is further configured to:
perform the programming operation on a plurality of memory cells of a first segment of the segments according to the memory cell order;
select, when all of the memory cells of the first segment are programmed, a second segment of the segments according to the segment order; and
perform the programming operation on a plurality of memory cells of the second segment according to the memory cell order.

16. The memory device according to claim 15, wherein the controller is further configured to:
use one of the segments as a read segment one by one according to the segment order, and read a first bit memory cell of the read segment to determine whether the read segment has a programmed first bit memory cell, and
when determining that the read segment of the segments has the programmed first bit memory cell and the read segment is not a last segment, use a next segment as the read segment according to the segment order to read a first bit memory cell of the read segment.

17. The memory device according to claim 16, wherein the controller is further configured to:
when determining that the read segment does not have the programmed first bit memory cell, use a previous segment as the read segment according to the segment order, and read a plurality of memory cells of the read segment one by one from a second bit memory cell of the read segment according to the memory cell order, and
learning the last programmed memory cell according to one of a determining result that an unprogrammed memory cell is read from the read segment for the first time and a determining result that a plurality of memory cells of the read segment are all programmed.

18. The memory device according to claim 11, wherein the controller is further configured to:
perform the programming operation on a first bit memory cell of each of the segments according to the segment order, and
perform, after the first bit memory cell of each of the segments is programmed, the programming operation on a second bit memory cell of each of the segments according to the segment order and the memory cell order.

19. The memory device according to claim 18, wherein the controller is further configured to:
use a last segment of the segments as a read segment,
read a plurality of memory cells of the read segment one by one from the first bit memory cell of the read segment according to the memory cell order to determine whether the memory cells of the read segment are programmed, and when determining that an $i^{th}$ bit memory cell of the read segment is not programmed, use a previous segment as the read segment according to the segment order, and read an $i^{th}$ bit memory cell of the read segment to determine whether the $i^{th}$ bit memory cell of the read segment is programmed, wherein i is a positive integer greater than 0.

20. The memory device according to claim 19, wherein the controller is further configured to learn the last programmed memory cell according to one of the following conditions:

it is determined that a read memory cell is a last bit memory cell of the last segment;

it is determined that the read memory cell is a programmed memory cell of a segment other than the last segment; and it is determined that the read segment is a first segment of the segments.

\* \* \* \* \*